US006590950B1

United States Patent
Mycynek

(10) Patent No.: US 6,590,950 B1
(45) Date of Patent: Jul. 8, 2003

(54) BANDWIDTH STABILIZED PLL

(75) Inventor: Victor G. Mycynek, Des Plaines, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/255,059

(22) Filed: Feb. 22, 1999

(51) Int. Cl.[7] .................................................. H03D 3/24
(52) U.S. Cl. ...................................... 375/376; 329/325
(58) Field of Search .............................. 375/316, 327, 375/345, 346, 373, 375, 376; 329/307, 325; 455/204

(56) References Cited

U.S. PATENT DOCUMENTS

| 5,440,586 A | * | 8/1995 | Den Braber | 375/327 |
| 5,781,065 A | * | 7/1998 | Mycynek et al. | 329/325 |
| 6,023,614 A | * | 2/2000 | Bargauan | 455/203 |
| 6,069,524 A | * | 5/2000 | Mycynek et al. | 329/308 |

* cited by examiner

Primary Examiner—Stephen Chin
Assistant Examiner—Lenny Jiang

(57) ABSTRACT

A bandwidth stabilized PLL in an FPLL has an I channel including an I channel signal, having a pilot, and a Q channel signal. The DC offset, including the pilot, of the I channel signal is determined. The value of the pilot is found by subtracting the determined DC offset from the I channel signal. An error signal is developed from the known value of the transmitted pilot and the determined value of the pilot. The error signal is used to control a gain block for the Q channel for stabilizing the bandwidth of the PLL. Different embodiments are shown for controlling the gain of the PLL from both inside and outside of the PLL.

23 Claims, 2 Drawing Sheets

BANDWIDTH STABILIZED PLL

BACKGROUND OF THE INVENTION

This invention relates generally to PLLs (phase locked loops) and specifically to PLLs that are used in FPLLs (frequency and phase locked loops) that have an I (in-phase) channel, including a demodulated pilot, and a Q (quadrature) channel.

In digital VSB (vestigial side band) television signals, a small pilot is transmitted to aid in initially receiving the television signal and subsequently locking to the received television signal. When the television signal is demodulated, the pilot is in the form of a DC offset. The VSB receiver optimally has an FPLL, that includes a PLL. The PLL has a bandwidth that is dependent upon pilot level and is therefore sensitive to noise and other channel impairments (such as a "ghosted" 180° out of phase pilot) which reduce the pilot level and cause a narrowing of the PLL bandwidth. The narrowed bandwidth results in reduced tracking-out of burst and phase noise components that are associated with the pilot. Such phase and burst noise components can arise from tuners and other heterodyning devices that have noisy oscillators.

In a digital VSB receiver, excess burst and phase noise must be removed by the digital phase tracker prior to data slicing. Optimum performance depends upon achieving a balance between the operation of the pilot-tracking PLL and the digital phase tracker. Consequently, stabilization of the bandwidth of the pilot-tracking PLL is highly desired. The present invention provides a stabilization system for the PLL.

OBJECTS OF THE INVENTION

A principal object of the invention is to provide a novel PLL bandwidth stabilization system.

Another object of the invention is to provide a VSB television receiver having an FPLL with a bandwidth stabilized PLL.

A further object of the invention is to provide an improved VSB television receiver.

BRIEF DESCRIPTION OF THE DRAWINGS

These and other objects and advantages of the invention will be apparent upon reading the following description in conjunction with the drawings in which.

DETAILED DESCRIPTION OF THE INVENTION

The stabilization system of the present invention is based upon the ability to determine the DC average of the demodulated I channel output signal. For the condition of non pilot lock, that is where the voltage controlled oscillator (VCO) has not yet been locked by the PLL, the I channel output represents the DC offset of the I channel (i.e., the DC offset introduced by the demodulation process). For normal operation (with the VCO locked to the pilot) the I channel output represents the DC offset plus the peak value of the pilot. In an FPLL, the polarity of the pilot (and data) may either be positive or negative at lock up. Consequently this possibility must be taken into consideration when the DC offset level is determined.

The I channel output represents the received data signal and the pilot signal and the unwanted DC offset. To measure the received pilot signal, the I signal is first low-pass-filtered to remove the data signal. The filtered signal contains the received pilot signal along with any DC offset signal. The DC offset signal, which is determined separately, is subtracted from the filtered signal, to form a signal whose positive and negative magnitudes represent the measured pilot signal. A divider circuit forms the ratio of a reference pilot signal to the measured pilot signal to determine the feed-forward error correction voltage Es to be applied to the PLL loop gain-determining multiplier.

Since Es represents the ratio of the reference pilot value to the measured pilot value, the signal may be fed back to the PLL to correct the loop gain (inside or outside of the PLL) to stabilize the PLL bandwidth. The stabilized PLL bandwidth assures the ability of the system to track-out phase and burst noise that would otherwise corrupt the later digital processing circuitry.

Figure 1:
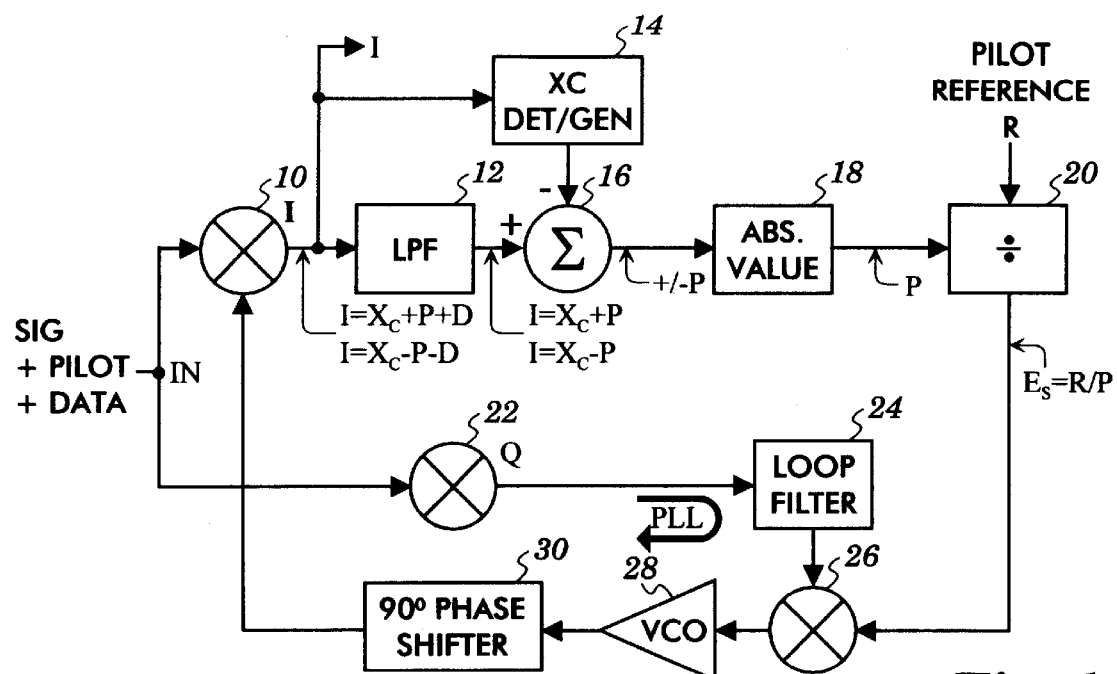
FIG. 1 illustrates a portion of an FPLL having a PLL constructed in accordance with the invention.

FIG. 1 discloses a partial FPLL that includes a PLL, the bandwidth of which is stabilized in accordance with the invention. The FPLL includes an I channel mixer (multiplier) 10, a Q channel mixer 22, a loop filter 24, a VCO 28 and a 90° phase shifter 30. A multiplier (gain block) 26 is used for gain control purposes in the invention. All of these elements are well-known in the art, with the PLL loop being indicated by the curved arrow. Additionally, a DC offset detector/generator 14 is included in the I channel. The arrangement is illustrated in analog form and includes a low pass filter (LPF) 12 that is coupled to the output of I multiplier 10 and which supplies a combining circuit (adder) 16. The output of I multiplier 10 is also supplied to DC offset detector/generator 14 that develops a DC offset signal Xc that is coupled to the negative input of adder 16. The value of Xc is determined as described in connection with FIG. 2, below. The signal resulting from the subtraction of Xc from the filtered I channel signal is supplied, through an absolute value circuit 18, to a divider 20, which is supplied with a pilot reference signal R for generating the pilot gain error signal Es. The error signal Es is supplied to the input of multiplier 26. This is the preferred embodiment of the invention, but the invention may also be implemented in other ways as indicated in FIGS. 1A and 1B, in which the location of the gain multiplier 26 is changed.

In the above circuit, the I channel signal includes a DC offset signal Xc, a pilot signal P and a data signal D. Because the FPLL may lock up in either of two polarities, the signals P and D may either be both positive or both negative. The DC offset signal Xc is always positive irrespective of the lock up polarity of the FPLL. Thus the signal output of I multiplier 10 is Xc+/−(P+D). LPF 12 removes the data signal D and therefore the signal supplied to adder 16 is Xc+/−P. The DC offset Xc is subtracted in adder 16 and the signal supplied to the absolute value circuit 18 is +/−P. Therefore, the absolute value of the pilot signal P is supplied to divider circuit 20 where the error signal Es is developed as the ratio of the reference pilot signal R divided by the received or measured pilot signal P. If Es is greater than unity, (pilot signal P smaller than the reference pilot R) the gain of multiplier 26 is increased, thus increasing the loop gain of the PLL. Similarly for Es less than unity (P greater than R), the gain of multiplier 26 is decreased and the PLL loop gain is decreased. In this embodiment, the gain of the PLL loop is controlled from inside the loop.

Figure 1A:
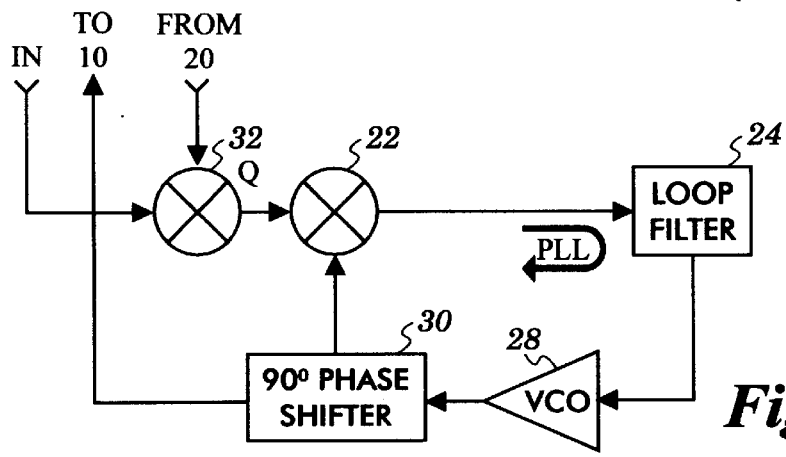
FIG. 1A shows a variation of the PLL of FIG. 1.
Figure 1B:
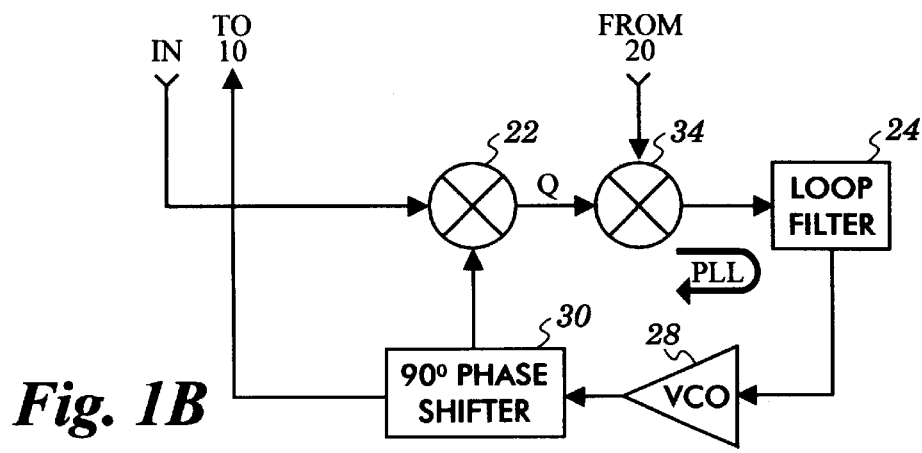
FIG. 1B shows another variation of the PLL of FIG. 1.

In FIG. 1A, gain multiplier 26 is removed and a gain multiplier 32 is included before the Q multiplier 22. The error signal Es is applied to control the gain of the gain multiplier 32 and the circuit operates in the same manner, with the gain control being exerted outside of the PLL loop. Similarly, in FIG. 1B, a gain multiplier 34 is included between the Q multiplier 22 and the loop filter 24, with the circuit operating as that in FIGS. 1 and 1A. Here again the loop gain is controlled from within the PLL loop. The gain multiplier (in all of the embodiments) therefore has the effect of correcting the loop gain of the PLL, under control of the pilot gain error signal Es, and serves to stabilize the system bandwidth.

There are a number of techniques for finding the value of the DC offset signal Xc. For example, an average DC offset detector can be employed to determine the value of Xc by: measuring the average positive, locked-pilot value Xp; measuring the average negative, locked-pilot value Xn; adding Xp and Xn together; and dividing by two. The equation is Xc=(Xp+Xn)/2. A practical flow chart of a method of implementation is illustrated in FIG. 2.

Figure 2:
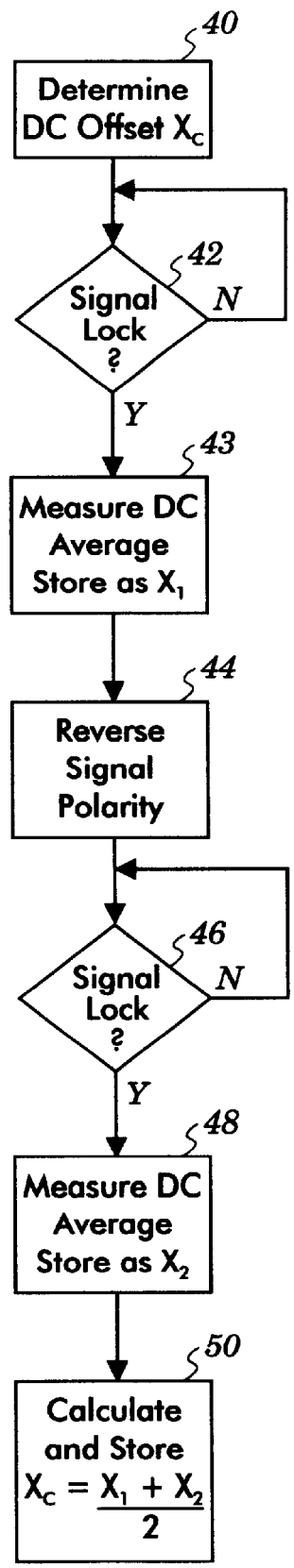
FIG. 2 is a flow chart illustrating how the average DC offset Xc is determined.

In FIG. 2, the process of determining the DC offset signal Xc is accomplished in a calibration mode with a normal signal input including a pilot. Signal lock is attained in step 42 followed by measuring and storing the average DC of the signal as X1. The signal polarity is reversed in step 44 and signal lock is again determined in step 46. The average DC of the signal is again measured and stored as X2 in step 48. Finally, in step 50, the value of Xc is calculated and stored from the equation Xc=(X1+X2)/2. If the initial calibration procedure produces a negative locked pilot, X1 takes on the value of Xn and X2 takes on the value of Xp. Conversely, if the initial calibration procedure produces a positive locked pilot, X1 takes on the value of Xp and X2 takes on the value of Xn. In either case, Xc is calculated correctly since the sum of X1 and X2 is needed in the calculation. The reversal in the polarity of the locked pilot is accomplished by a well-known pilot polarity determining and recovering circuit (not shown).

It will be appreciated that the value of the reference pilot signal R is known from the signal as transmitted and consequently, the error voltage Es may be readily determined from the reference pilot P and the measured or received pilot P for carrying out the invention.

What has been described is a novel arrangement for stabilizing the bandwidth of a PLL. It is recognized that numerous changes in the described embodiments of the invention will occur to those skilled in the art without departing from its true spirit and scope. The invention is to be limited only as defined in the claims.

What is claimed is:

1. A method of operating a pilot tracking PLL in an FPLL comprising:
   determining the DC level of the transmitted pilot in an I channel signal;
   forming a pilot gain error signal as a ratio of the DC level of the known transmitted pilot to the DC level of the determined pilot; and
   adjusting the gain of the PLL with the pilot gain error signal to maintain a substantially constant PLL bandwidth.

2. The method of claim 1, wherein said pilot determining step comprises:
   filtering the I channel signal to remove data.

3. The method of claim 1, wherein said pilot determining step comprises:
   determining the DC offset of the I channel signal including the pilot; and
   removing the determined DC offset from the I channel signal.

4. The method of claim 2, wherein the DC offset determining step further comprises:
   measuring the DC offsets with the FPLL locked in opposite signal polarities; and
   averaging the measured DC offsets.

5. The method of claim 4, further comprising correcting the loop gain outside the PLL with the pilot gain error signal.

6. The method of claim 4, further comprising correcting the loop gain inside the PLL with the pilot gain error signal.

7. A method of operating a pilot tracking PLL in an FPLL comprising:
   processing an I channel signal having a DC offset, including a pilot and data, to remove the data;
   determining the DC offset of the I channel signal, including the pilot;
   determining the DC level of the pilot;
   determining a pilot gain error signal from the DC level of the known transmitted pilot, the determined DC offset and the DC level of the determined pilot; and
   adjusting the gain of the PLL with the pilot gain error signal to maintain a substantially constant PLL bandwidth.

8. The method of claim 7, wherein the DC offset determining step further comprises:
   measuring the DC offsets with the FPLL being locked in opposite signal polarities; and
   averaging the measured DC offsets.

9. The method of claim 8, further comprising correcting the loop gain outside the PLL with the pilot gain error signal.

10. The method of claim 8, further comprising correcting the loop gain inside the PLL with the pilot gain error signal.

11. A pilot tracking PLL for use in an FPLL comprising:
    means comprising an I channel having an I channel signal containing a pilot and data, and a Q channel having a Q channel signal;
    means for determining the DC level of said pilot in said I channel signal;
    means for forming an error signal as a ratio of the DC level of a known transmitted pilot to said determined DC level of said pilot; and
    multiplier means for adjusting the loop gain of said PLL with said error signal to maintain a substantially constant bandwidth for said PLL.

12. The PLL of claim 11, wherein said pilot determining means includes a low pass filter for removing said data.

13. The PLL of claim 11, wherein said pilot determining means comprises:
    means for determining the value of the DC offset in said I channel signal; and
    means for subtracting said DC offset from said I channel signal.

14. The PLL of claim 13, wherein said pilot determining means further includes an absolute value circuit coupled to said subtracting means.

15. The PLL of claim 13, wherein said DC offset determining means comprises:
    means for determining first and second DC offsets corresponding to opposite phases of lock up of said FPLL; and
    means for averaging said first and said second DC offsets.

16. The PLL of claim 15, further including:

a gain block in said Q signal channel; and said error signal controlling the gain of said gain block for correcting said loop gain inside said PLL.

17. The PLL of claim 15, further including:

a gain block coupled to said Q channel; and said error signal controlling the gain of said gain block for correcting said loop gain outside said PLL.

18. A pilot tracking PLL for use in an FPLL comprising:

means comprising an I channel, having an I channel signal containing a pilot and data, and a Q channel having a Q channel signal;

filter means for removing said data;

means for determining the value of said pilot in said I channel signal;

means for forming an error signal as a ratio of the value of a known transmitted pilot to said determined value of said pilot; and a gain block for said Q channel controlled in response to said error signal to stabilize the bandwidth of said PLL.

19. The PLL of claim 18, wherein said pilot determining means comprises:

means for determining the value of the DC offset in said I channel signal; and means for subtracting said DC offset from said I channel signal.

20. The PLL of claim 19, wherein said DC offset determining means comprises:

means for determining first and second DC offsets corresponding to opposite phases of lock up of said FPLL; and means for averaging said first and said second DC offsets.

21. The PLL of claim 19, wherein said pilot determining means further includes an absolute value circuit coupled to said subtracting means.

22. The PLL of claim 21, wherein said error signal controls the gain of said gain block for correcting said loop gain inside said PLL.

23. The PLL of claim 21, wherein said error signal controls the gain of said gain block for correcting said loop gain outside said PLL.

* * * * *